(12) United States Patent
Xu et al.

(10) Patent No.: US 8,575,493 B1
(45) Date of Patent: Nov. 5, 2013

(54) INTEGRATED CIRCUIT DEVICE HAVING EXTENDED UNDER BALL METALLIZATION

(75) Inventors: Yong Li Xu, Plano, TX (US); Duane Thomas Wilcoxen, Dallas, TX (US); Yi-Sheng Sun, San Jose, CA (US); Viren Khandekar, Flower Mound, TX (US); Arkadii Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 117 days.

(21) Appl. No.: 13/033,675

(22) Filed: Feb. 24, 2011

(51) Int. Cl.
*H05K 1/03* (2006.01)
(52) U.S. Cl.
USPC .......................................... 174/255; 174/260
(58) Field of Classification Search
USPC .......... 174/255, 256, 260, 267; 361/808, 760, 361/767; 228/246; 257/690, 700, 737, 780
See application file for complete search history.

(56) References Cited

U.S. PATENT DOCUMENTS

| | | | |
|---|---|---|---|
| 2003/0134496 A1* | 7/2003 | Lee et al. ...................... | 438/612 |
| 2008/0142968 A1* | 6/2008 | Jadhav et al. ................. | 257/738 |
| 2011/0115074 A1* | 5/2011 | Hu et al. ....................... | 257/737 |
| 2011/0241201 A1* | 10/2011 | Wang et al. .................... | 257/737 |

OTHER PUBLICATIONS

Flip Chip International; Bumping Design Guide; May 2009; http://www.flipchip.com/docs/fci_bump_design_guide.pdf.

* cited by examiner

*Primary Examiner* — Yuriy Semenenko
(74) *Attorney, Agent, or Firm* — Advent, LLP

(57) ABSTRACT

Semiconductor devices are described that have an extended under ball metallization configured to mitigate dielectric layer cracking due to stress, particularly stress caused by CTE mismatch during thermal cycling tests, dynamic deformation during drop tests, or cyclic bending tests, and so on. In an implementation, the semiconductor package devices include an integrated circuit chip having a solder ball and under ball metallization, formed on the integrated circuit chip, which is configured to receive the solder ball so that the solder ball and the under ball metallization have a contact area there between, wherein the area of the under ball metallization is area greater than the contact area.

8 Claims, 6 Drawing Sheets

INTEGRATED CIRCUIT DEVICE HAVING EXTENDED UNDER BALL METALLIZATION

BACKGROUND

Traditional fabrication processes used in the manufacture of semiconductor devices employ microlithography to pattern integrated circuits onto a circular wafer formed of a semiconductor such as silicon. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board. These packaging technologies are constantly evolving to develop smaller, cheaper, more reliable, and more environmentally-friendly packages.

Wafer-level packaging, a type of chip-scale packaging technology, has been used to package integrated circuit chips at wafer level, prior to segmentation. Wafer-level packaging extends the wafer fabrication processes to include device interconnection and device protection processes. For example, under ball metallization (UBM) may be applied to each peripheral bonding pad of each chip in the wafer. The UBM typically provides a strong, stable, low resistance electrical connection between a contact pad (e.g., an aluminum pad) of the device and a solder ball since contact pads are usually not a readily solderable surface. The UBM may also provide an electrical connection between a solder ball and a redistribution structure, which redistributes the peripheral bonding pads of each chip to an area array of pads (e.g., which may be formed of UBM) that are deployed over the chip's surface.

SUMMARY

Semiconductor devices are described that have an extended under ball metallization configured to mitigate dielectric layer cracking due to stress, particularly stress caused by CTE mismatch during thermal cycling tests, dynamic deformation during drop tests or cyclic bending tests, and so on. In an implementation, the semiconductor package devices include an integrated circuit chip having a solder ball and under ball metallization (UBM) formed on the integrated circuit chip, wherein the UBM is configured to receive the solder ball. The under ball metallization and solder ball have a contact area there between, wherein the under ball metallization extends beyond the contact area so that the area of the under ball metallization is greater than the contact area.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
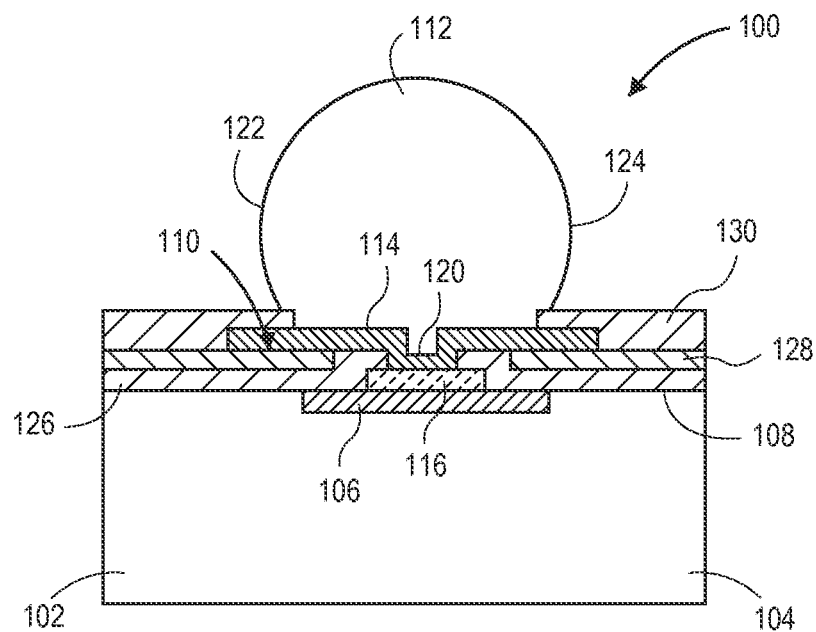
FIG. 1A is a diagrammatic partial cross-sectional side elevation view illustrating a semiconductor device that has a ball-on-pad (BOP) configuration in accordance with an example implementation of the present disclosure.

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with dies having a surface area of less than about 25 $mm^2$). For devices employing larger chips, the mismatch of the coefficient of thermal expansion (CTE) between the chip and the printed circuit board (FR4) to which the device is mounted becomes significant. During thermal cycling tests, this mismatch can cause high stress and cracks in the devices.

Accordingly, techniques are described for fabricating semiconductor devices having an extended under ball metallization (UBM) configured to mitigate stress in the devices, particularly stresses caused by CTE mismatch, dynamic deformation during drop tests or cyclic bending tests, and so on. Such semiconductor devices may be employed in a variety of applications including, but not limited to: system on chip (SOC) applications, dynamic random access memory (DRAM) applications, and central processing unit (CPU) applications.

In an implementation, the semiconductor devices include an integrated circuit chip having a solder ball and under ball metallization (e.g., in a Ball-on-Pad (BOP) configuration, a Redistribution Line (RDL) configuration, or so on). The under ball metallization is formed on the integrated circuit chip, and is configured to receive a solder ball so that the interface of the solder ball and the under ball metallization defines a contact area. The under ball metallization extends beyond contact area defined by the edges of the solder ball coupled to the under ball metallization area so that the area of under ball metallization is greater than the contact area (e.g., the diameter of the under ball metallization is greater than the diameter of the contact area). Thus, the under ball metallization may provide structural support to the semiconductor device, which reduces stress to the device during various testing procedures (e.g., temperature cycling, drop test, etc.).

Example Implementations

FIGS. 1A through 5 illustrate semiconductor package devices 100 in accordance with example implementations of the present disclosure. As shown, the devices 100 include an integrated circuit chip 102 having a substrate 104 and one or more integrated circuit(s) 106 formed in a surface 108 of the substrate 104. The substrate 104 may be comprised of a portion of a wafer that furnishes a base material utilized to form one or more integrated circuit(s) 106. Under ball metallization (UBM) 110 is formed on the device 100 and is configured provide a solderable surface to receive a solder ball 112. The UBM 110 and the solder ball 112 form a contact area 114 there between.

More particularly, as shown, one or more contact pads 116 are formed on the surface 108 of the integrated circuit chip 102 and coupled to the integrated circuit(s) 106. Thus, in implementations, the devices 100 may be configured as a Bump on Pad ("BOP") device (shown in FIGS. 1A, 2A, 3A, and 4A) or a Redistribution Line ("RDL") device (shown in FIGS. 1B, 2B, 3B, and 4B). When configured as an RDL device, the integrated circuit chip 102 further includes a redistribution structure 118 to redistribute electrical connectivity to the integrated circuit(s) 106.

Figure 1B:
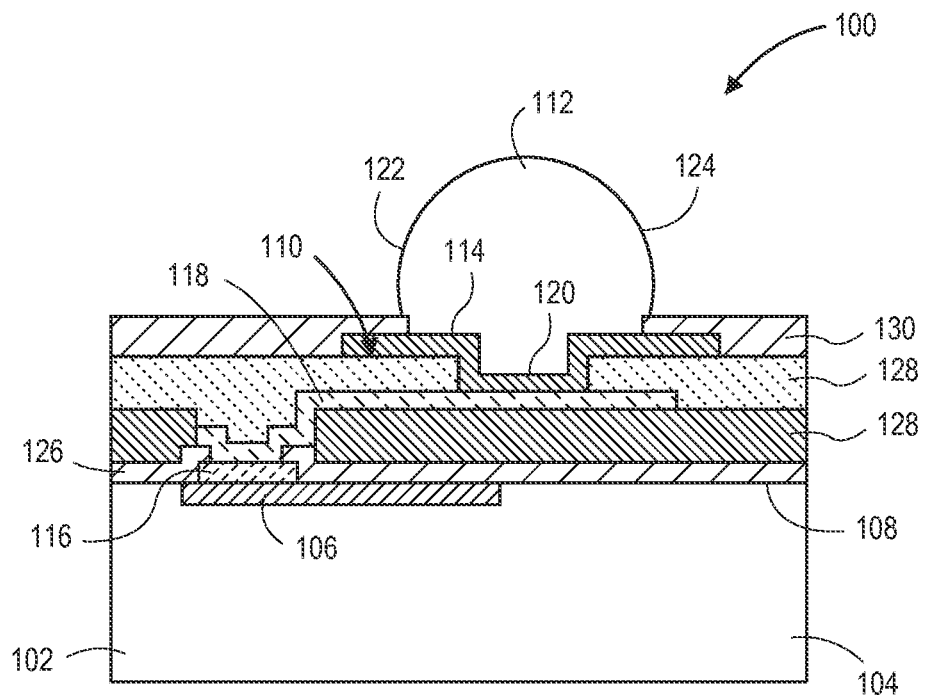
FIG. 1B is a diagrammatic partial cross-sectional side elevation view illustrating a semiconductor device that has a redistribution line (RDL) configuration in accordance with another example implementation of the present disclosure.

The UBM 110 may be configured in a variety of ways. In an implementation, the UBM 110 provides a reliable interconnect boundary connection between the solder ball 112 and the contact pad 116 in the BOP device (FIGS. 1A, 2A, 3A, and 4A). In another implementation, the UBM 110 provides a reliable interconnect boundary connection between the solder ball 112 and the redistribution structure 118 in the RDL device (FIG. 1B). The UBM 110 may be manufactured from one or more electrically conductive materials (e.g., copper, chromium, tin, nickel, silver, combinations thereof, or the like). The top layer 120 of the UBM 110, which is configured to receive the solder ball 112, is solderable. The UBM 110 may be approximately three (3) microns to approximately eight (8) microns thick. In a specific implementation, the UBM 110 is approximately six (6) microns thick. Example processes for forming the UBM 110 are described in more detail below.

Solder balls 112 are provided to furnish mechanical and/or electrical interconnection between the UBM 110 and corresponding pads formed on the surface of the printed circuit board (not shown). As illustrated in FIGS. 1A and 1B, the solder balls 112 include a first edge 122 and a second edge 124. In one or more implementations, the solder balls 112 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. However, it is contemplated that Tin-Lead (PbSn) solders may be used. Example processes for forming the solder balls 112 using wafer-level packaging techniques are described in more detail below.

In one or more implementations, the contact pad 116 comprises an electrically conductive pad (e.g., an aluminum contact pad, or the like) that is configured to provide an electrical interconnection between the integrated circuit(s) 106 and various other elements (e.g., under ball metallization, redistribution line, etc.) of the device 100. In the implementation shown in FIG. 1A, the contact pad 116 provides an electrical interconnection between the integrated circuit 106 and the UBM 110. In the implementation shown in FIG. 1B, the contact pad 116 provides an electrical interconnection between the integrated circuit 106 and the redistribution line 118. Moreover, as shown in FIGS. 1A and 1B, an insulating material 122 at least partially encloses the contact pad 116. The insulating material 126 encloses the portion(s) of the contact pad 116 that is not covered by the UBM 110. In an implementation, the insulating material 126 may be comprised of a silicon oxide material, a silicon nitride material, benzocyclobutene polymer (BCB), polyimide, combinations thereof, or the like.

Figure 5:
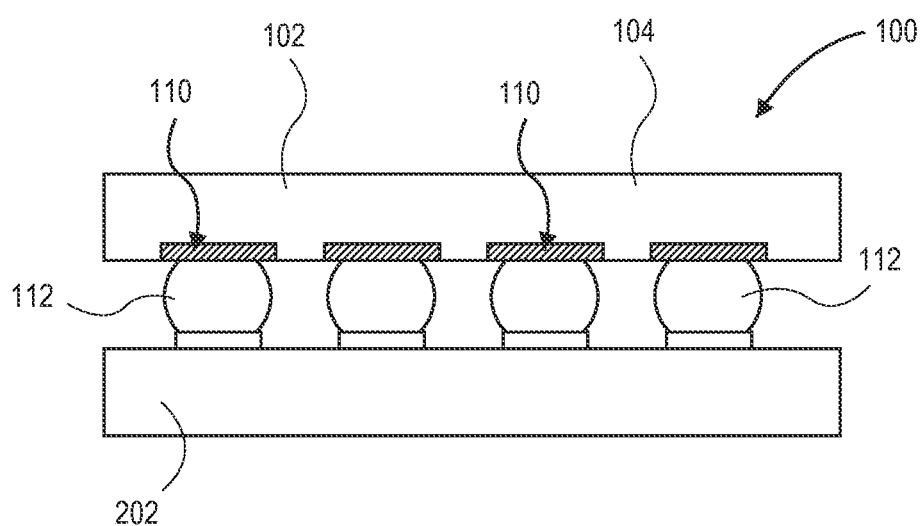
FIG. 5 is a diagrammatic partial cross-sectional elevation view illustrating the semiconductor package devices of FIGS. 1A through 4B mounted to the printed circuit board of an electronic device.
Figure 6:
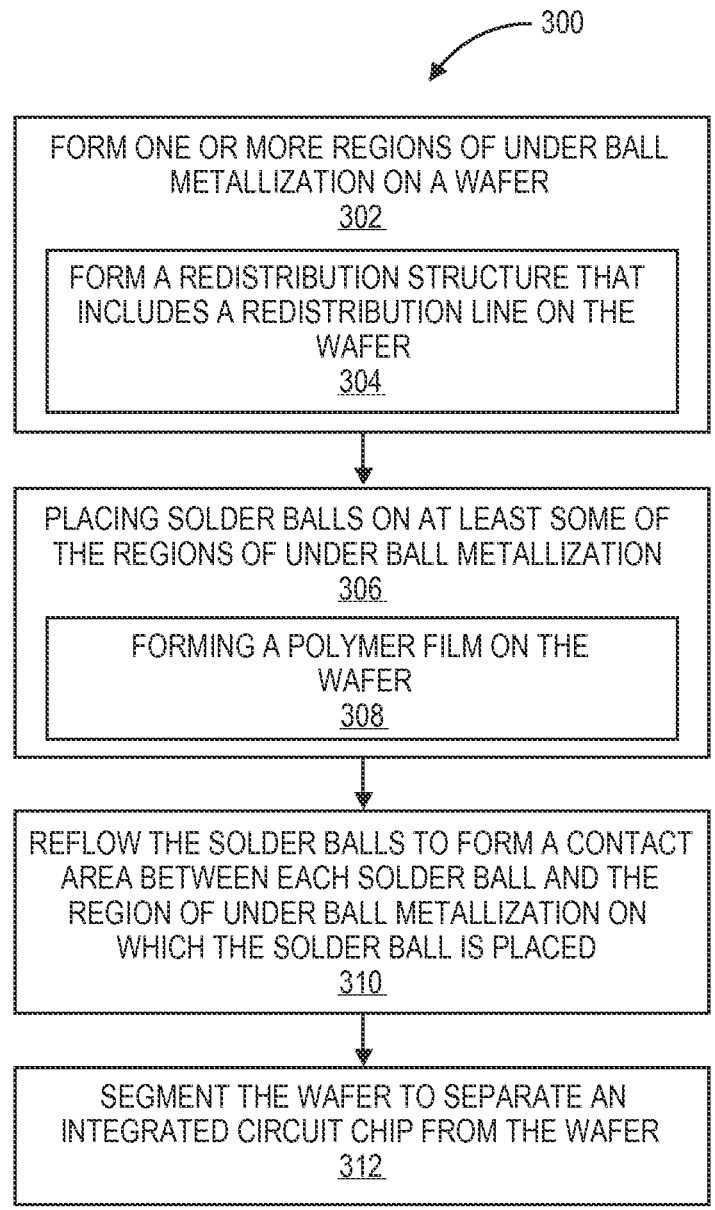
FIG. 6 is a flow diagram illustrating a process in an example implementation for fabricating semiconductor package devices, such as the devices shown in FIGS. 1A through 4B.

As described above, in an implementation, the redistribution structure 118 is formed on the device 100 over the integrated circuit(s) 106. The redistribution structure 118 may be configured in a variety of ways. For example, the redistribution structure 118 may be comprised of a redistribution line, or the like. One or more metal layers (e.g., approximately three (3) microns to approximately four (4) microns thick) may comprise the redistribution structure 118. For instance, the metal layer(s) may be comprised of titanium, copper, nickel, polysilicon, combinations thereof, or the like. The redistribution structure 118 redistributes peripheral bonding pads of the integrated circuit(s) 106 to one or more area arrays of contact pads 116 that are deployed over the surface of the integrated circuit chip 102. The configuration of the redistribution structure 118 and/or the number and configuration of contact pads 116 provided by the redistribution structure 118 may vary depending on the complexity and configuration of the integrated circuit(s) 106, the size and shape of the integrated circuit chip 102, and so forth. The contact pads 116 provide electrical contacts through which the integrated circuits 106 are interconnected to external components such as printed circuit boards. FIG. 5 illustrates the semiconductor package devices 100 of FIGS. 1A and 1B mounted to the printed circuit board 202 of an electronic device.

As illustrated in FIGS. 1A and 1B, one or more dielectric layer(s) 128 and a polymer 130 are formed on the integrated circuit chip 102. The dielectric layer(s) 128 may be comprised of benzocyclobutene polymer (BCB), silicon dioxide (SiO$_2$), polyimide, or the like. The polymer layer 130 may be comprised of benzocyclobutene polymer (BCB), polyimide, or the like. The dielectric layer(s) 128 may serve to insulate the layers formed below the dielectric layer(s) 128 (e.g., the redistribution structure 118, the insulating material 126, etc.) The polymer layer 130 may serve to define the contact area 114 and the solder ball 112 boundary. Moreover, the polymer layer 130 may be formed at least partially over the UBM 110 to insulate the UBM 110.

Figure 2A:
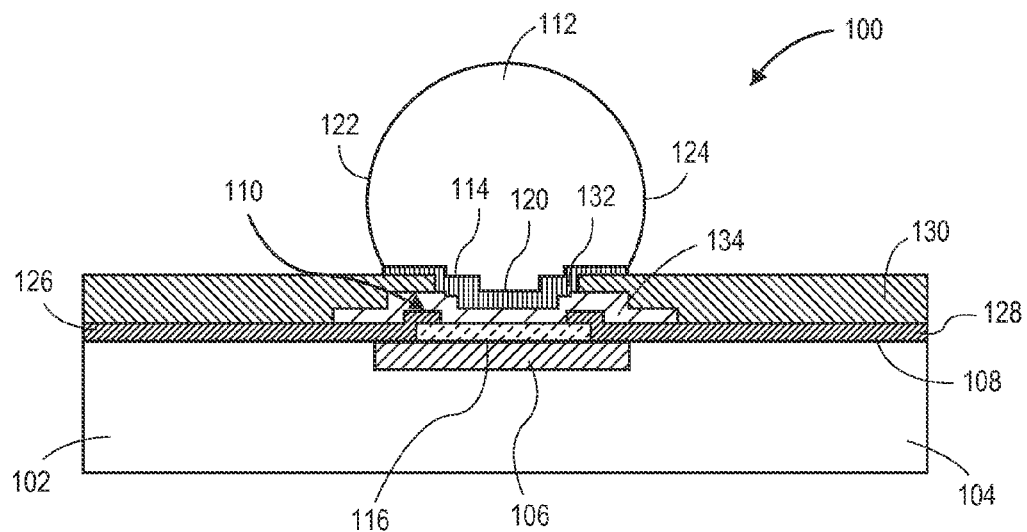
FIG. 2A is a diagrammatic partial cross-sectional side elevation view illustrating a semiconductor device that has a ball-on-pad (BOP) configuration in accordance with another example implementation of the present disclosure.
Figure 2B:
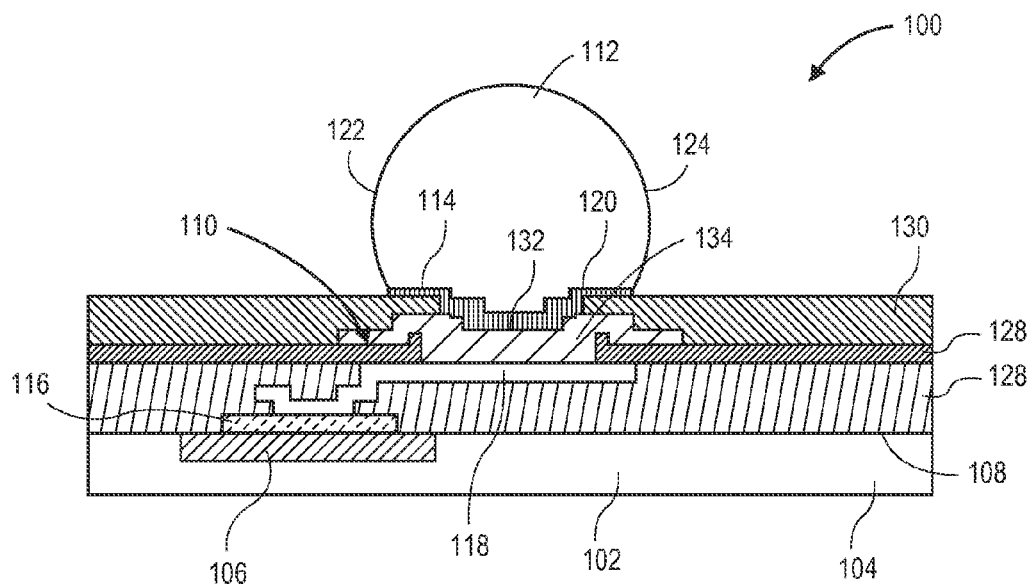
FIG. 2B is a diagrammatic partial cross-sectional side elevation view illustrating a semiconductor device that has a redistribution line (RDL) configuration in accordance with another example implementation of the present disclosure.

FIGS. 2A through 4B illustrate various implementations of semiconductor device 100. For example, as illustrated in FIGS. 2A and 2B illustrate the UBM 110 comprising a first conductive layer 132 and a second conductive layer 134. The first conductive layer 132 is at least substantially flush with the lower portion of the solder ball 112 (e.g., the portion proximate to the first conductive layer 132) and defines a contact area 114 at the interface of the first conductive layer 132 and the solder ball 112. Once formed, the area of the second conductive layer 134 is greater than the contact area 114, and the second conductive layer 134 at least extends past the edges 122, 124 of the solder ball 112. The dielectric layer(s) 128 may be at least substantially formed over the second conductive layer 134 to provide insulation to the second conductive layer 134. The first conductive layer 132 may be at least partially formed over and in the dielectric layer(s) 128 (after selectively etching the dielectric layer 128) as well as over the second conductive layer 134. In an implementation, the first and second layers 132, 134 may be comprised of conductive material such as metal (e.g., copper, chromium, tin, nickel, silver, combinations thereof, or the like).

Figure 3A:
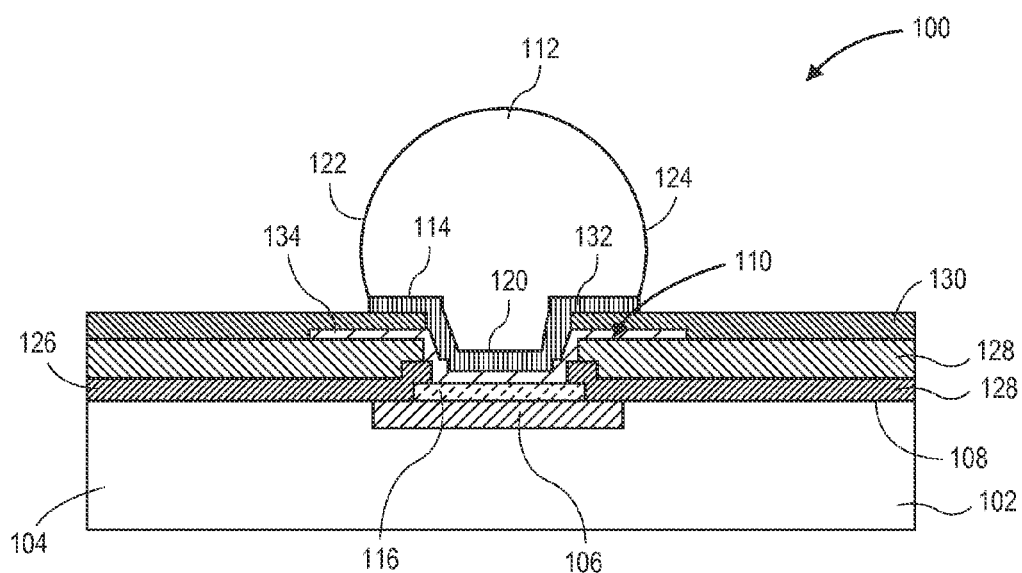
FIG. 3A is a diagrammatic partial cross-sectional side elevation view illustrating a semiconductor device that has a ball-on-pad (BOP) configuration in accordance with another example implementation of the present disclosure.
Figure 3B:
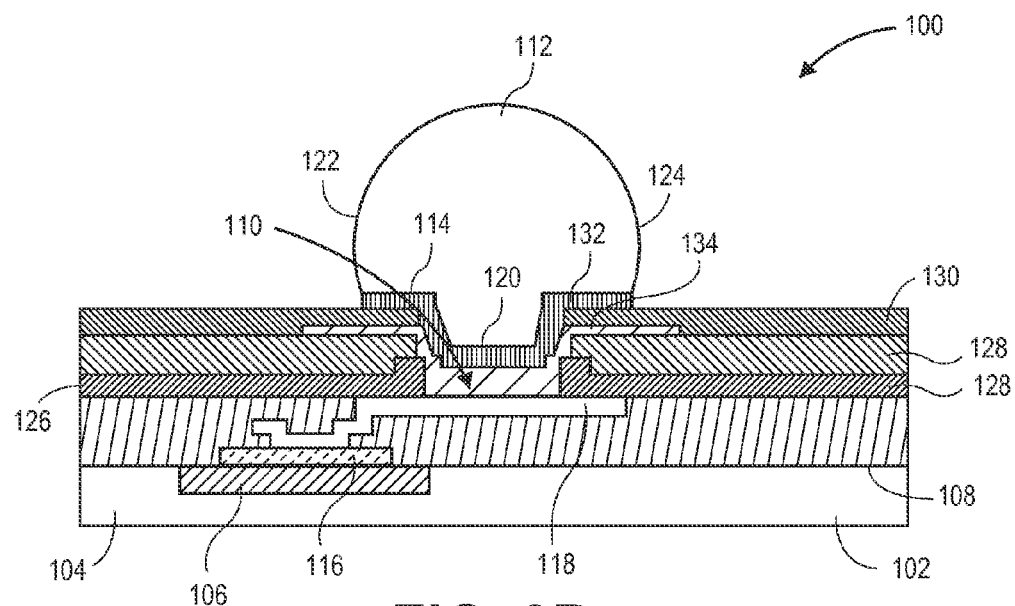
FIG. 3B is a diagrammatic partial cross-sectional side elevation view illustrating a semiconductor device that has a redistribution line (RDL) configuration in accordance with another example implementation of the present disclosure.

FIGS. 3A and 3B illustrate the UBM 110 comprising a first conductive layer 132 and a second conductive layer 134. The first conductive layer 132 is at least substantially flush with the lower portion of the solder ball 112 (e.g., the portion proximate to the first conductive layer 132) and defines a contact area 114 at the interface of the solder ball 112 and the first conductive layer 132. As described above, the area of the second conductive layer 134 is greater than the contact area 114, and the second conductive layer 134 at least extends past the edges 122, 124 of the solder ball 112. As illustrated in FIGS. 3A and 3B, the second conductive layer 134 is formed at least partially over and in the dielectric layer(s) 128 (after selectively etching of the first dielectric layer 128), and the polymer layer 130 is at least substantially formed over the second layer 134 to provide insulation to the second conductive layer 134. The first conductive layer 132 is formed at least partially over and in the polymer layer 130 as well as over the second layer 134.

Figure 4A:
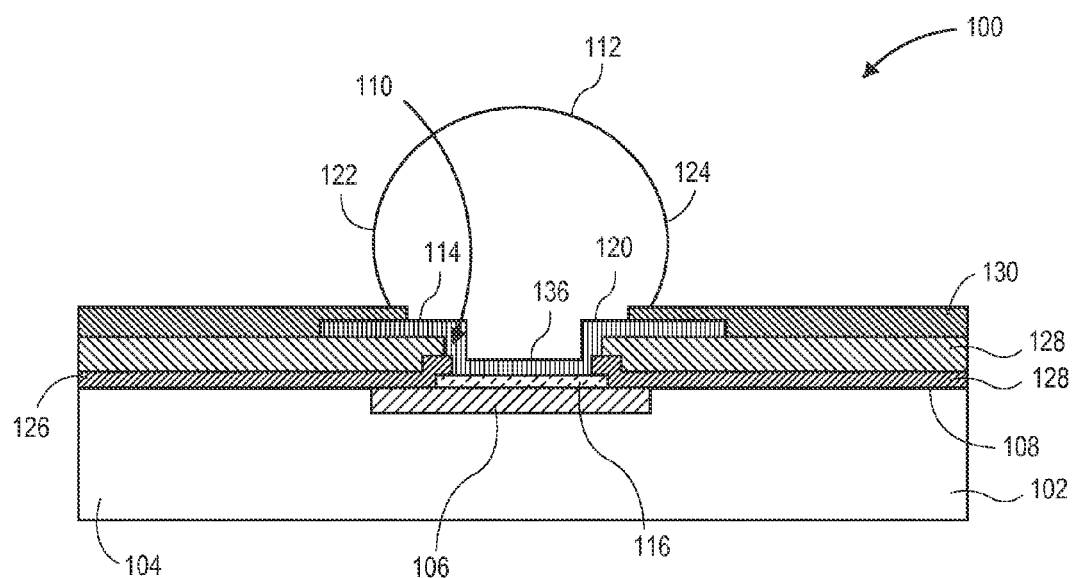
FIG. 4A is a diagrammatic partial cross-sectional side elevation view illustrating a semiconductor device that has a ball-on-pad (BOP) configuration in accordance with another example implementation of the present disclosure.
Figure 4B:
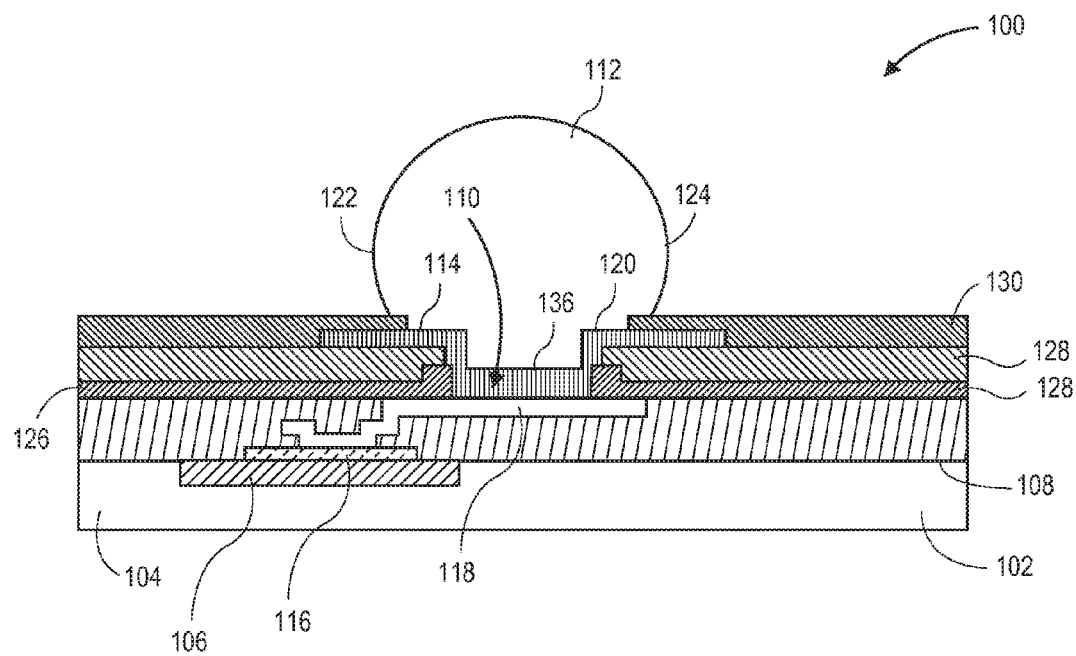
FIG. 4B is a diagrammatic partial cross-sectional side elevation view illustrating a semiconductor device that has a redistribution line (RDL) configuration in accordance with another example implementation of the present disclosure.

FIGS. 4A and 4B illustrate the UBM 110 comprised of an electrically conductive layer 136 formed at partially in and over the dielectric layer(s) 128. The contact area 114 is formed at the interface of the solder ball 112 and the conductive layer 136. The conductive layer 136 extends past the edges 122, 124 of the solder ball 112 so that the area of the conductive layer 136 is greater than the contact area 114. Once the solder ball 114 is formed over the conductive layer 136, the polymer layer 130 is at least partially deposited over the conductive layer 136 and the dielectric layer(s) 128 to provide solder boundary definition.

In accordance with the present disclosure, a contact area 114 is formed at the interface of the solder ball 114 and the UBM 110 when the solder ball 112 is formed over the UBM 110. The area of the UBM 110 extends beyond the edges 122, 124 of the solder ball such that the area of the UBM 110 is greater than the area of the contact area 114 (e.g., the diameter of the UBM 110 is greater than the diameter of the contact area). In an implementation, the UBM 110 may extend beyond the first edge 122 by approximately twenty-five (25) microns and may extend beyond the second edge 124 by approximately twenty-five (25) microns.

The extension of the UBM 110 provides structural support to the devices 100 and may reduce the stress at the dielectric layer(s) 128. Various testing and simulations (e.g., temperature cycling tests, drop tests, etc.) of device 100 demonstrate that the extension of the UBM 110 reduces the stress applied to the dielectric layer(s) 128 by up to forty-two percent (42%). This reduction in stress may result in a reduction of dielectric cracks to the semiconductor devices 100.

Example Fabrication Processes

FIG. 5 illustrates an example process 300 that employs wafer-level packaging techniques to fabricate semiconductor devices, such as the devices 100 shown in FIGS. 1A through 5B. In the process 300 illustrated, one or more regions of under ball metallization are formed on a wafer configured to be segmented into integrated circuit chips (Block 302). As noted in the discussion of FIGS. 1A and 1B, the under ball metallization may be manufactured from one or more conductive materials (e.g., copper, chromium, tin, nickel, silver, combinations thereof, or the like). The under ball metallization may be formed utilizing suitable under ball metallization techniques. For example, the under ball metallization may be formed utilizing plating, sputtering, or the like. As illustrated in FIGS. 2A through 4B, the UBM 110 may be comprised of one or more highly conductive layers (e.g., layers 132, 134, 136). In an implementation, the under ball metallization may be approximately three (3) microns to approximately eight (8) microns thick. In a specific implementation, the under ball metallization may be approximately six (6) microns thick.

A redistribution structure that includes a redistribution line is formed (Block 304) before the formation of the under ball metallization in one or more implementations. As illustrated in FIGS. 1B, 2B, 3B, and 4B, the redistribution line (e.g., redistribution structure 118) is electrically interconnected with the under ball metallization 110 of an integrated circuit 106 formed on a wafer. The under ball metallization may be at least partially formed over the redistribution structure to provide an electrical interconnection between the solder ball and the redistribution structure. The redistribution structure may be formed utilizing suitable redistribution structure techniques. For example, the redistribution structure may be formed utilizing plating, sputtering, or the like. In one or more implementations, as show in FIGS. 1B, 2B, 3B, and 4B, the redistribution structure 118 is formed over a dielectric layer (e.g., dielectric layer(s) 128, or the like), which may be comprised of benzocyclobutene polymer (BCB), silicon dioxide ($SiO_2$), polyimide, or the like. The redistribution structure may be comprised of multiple conductive layers such as titanium, copper, nickel, polysilicon, combinations thereof, or the like. Once the redistribution structure is formed, another dielectric layer may be deposited over the semiconductor device to at least substantially enclose and insulate the redistribution structure. It will be appreciated that the redistribution structure 118 is an example of one possible redistribution structure. Other redistribution structures are possible.

Solder balls are placed on at least some of the regions of the under ball metallization (Block 306). As illustrated in FIGS. 1A through 4B, a solder ball 112 may be placed over the under ball metallization 110 region. The solder balls may be placed and/or formed in a variety of ways. For instance, the solder balls may be formed via a ball drop process. However, the solder balls may be placed utilizing other suitable solder ball placement and/or formation processes. A polymer film (e.g., polymer layer, such as polyimide) may be formed on the wafer (Block 308). The polymer film may extend at least partially over the regions of under ball metallization to define the contact area during reflow of the solder balls The solder balls are reflowed to form a contact area between each solder ball and the region of under ball metallization on which the solder ball is placed (Block 310). During reflow, the wafer comprising the integrated circuit chips is subjected to a controlled heat (e.g., via a solder reflow oven), which melts the solder balls, securing the solder to the under bump metallization. As illustrated in FIGS. 1A and 1B, one or more layer(s) of the under ball metallization 110 extends beyond the contact area 114 as well as the edges 122, 124 of the solder ball 112. Thus, the area of the under ball metallization is greater than the contact area. Moreover, the diameter of the under ball metallization is greater than the diameter of the contact area. The under ball metallization configuration serves to provide structural support to the device 100, which may reduce the stress at the one or more dielectric layers and may prevent dielectric cracking during various testing phases (e.g., temperature cycling, drop test, etc.) of the semiconductor devices.

The wafer is segmented to separate an integrated circuit chip from the wafer (Block 312), where the integrated circuit chip includes at least one region of the under ball metallization and the solder ball. The wafer may be segmented by backgrinding the wafer using a suitable backgrinding process and then segmented (e.g., diced) to separate the individual semiconductor devices. Suitable wafer-level packaging processes may be utilized to segment and package the individual semiconductor devices. For example, the segmented semiconductor devices may comprise wafer chip-scale package devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
an integrated circuit chip;
a solder ball; and
an under ball metallization formed on the integrated circuit chip, where the solder ball is disposed on the under ball metallization so that the solder ball and the under ball metallization have a contact area there between, the under ball metallization having an area that is greater than the contact area, where the under ball metallization extends past each edge of the solder ball.

2. The semiconductor device as recited in claim 1, wherein the area of the under ball metallization extends beyond the contact area.

3. The semiconductor device as recited in claim 2, wherein the contact area has a first diameter and an area of the under ball metallization has a second diameter, wherein the second diameter is greater than the first diameter.

4. The semiconductor device as recited in claim 1, further comprising a polymer film disposed on the integrated circuit chip and extending at least partially over the under ball metallization, the polymer film defining the contact area.

5. The semiconductor device as recited in claim 1, wherein the integrated circuit chip comprises an integrated circuit and a contact pad.

6. The semiconductor device as recited in claim 2, wherein the under ball metallization is formed over a contact pad and provides electrical interconnection between the contact pad and the solder ball.

7. The semiconductor device as recited in claim 5, further comprising a redistribution structure including a redistribution line electrically interconnected with the contact pad, wherein the under ball metallization is formed over the redistribution line and provides electrical interconnection between the solder ball and the redistribution line.

8. The semiconductor device as recited in claim 1, wherein the under ball metallization comprises at least two layers, at least one of the layers extending beyond the contact area.

* * * * *